United States Patent
Yu

(10) Patent No.: US 6,476,422 B1
(45) Date of Patent: Nov. 5, 2002

(54) ELECTROSTATIC DISCHARGE PROTECTION CIRCUIT WITH SILICON CONTROLLED RECTIFIER CHARACTERISTICS

(75) Inventor: Ta-Lee Yu, Hsinchu Hsien (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 0 days.

(21) Appl. No.: 09/478,736

(22) Filed: Jan. 6, 2000

(51) Int. Cl.[7] .......................... H01L 29/74; H01L 29/76
(52) U.S. Cl. ...................... 257/173; 257/362; 257/363; 257/360
(58) Field of Search .................. 257/355–363, 257/173; 361/56

(56) References Cited

U.S. PATENT DOCUMENTS

| | | | |
|---|---|---|---|
| 4,939,616 A | | 7/1990 | Rountree ...................... 361/56 |
| 5,173,755 A | * | 12/1992 | Co et al. .................... 257/361 |
| 5,237,395 A | * | 8/1993 | Lee ............................ 257/358 |
| 5,343,053 A | * | 8/1994 | Avery ......................... 257/173 |
| 5,465,189 A | | 11/1995 | Polgreen et al. ............... 361/58 |
| 5,856,214 A | * | 1/1999 | Yu ............................ 438/133 |
| 6,172,403 B1 | * | 1/2001 | Chen .......................... 257/355 |

FOREIGN PATENT DOCUMENTS

JP         7-263633       * 10/1995       ........... H01L/27/04

OTHER PUBLICATIONS

G. Notermans, "On the use of n–well resistors in ESD protections" Micro electronics Reliability 38 (1998) pp. 1741–1748.

* cited by examiner

Primary Examiner—Steven Loke
Assistant Examiner—Ori Nadav
(74) Attorney, Agent, or Firm—BakerBotts LLP

(57) ABSTRACT

An ESD protection circuit based on a modification of conventional silicon controlled rectifier (SCR) for preventing integrated circuits from ESD damage. A first N-well, which has a second N-type doped region and third P-type doped region, is formed in a P-type substrate. A fourth N-type doped region and fifth doped region are formed adjacent to the first N-well in the substrate. A first conducting structure is formed on the second N-type doped region and connected to an anode. A second conducting structure is formed on the fourth N-type doped region and fifth P-tape doped region and connected to a reference potential. Since the third P-type doped region is floated from connecting with the anode, the ESD protection circuit would thus have a higher trigger current than the conventional SCR

7 Claims, 5 Drawing Sheets

ELECTROSTATIC DISCHARGE PROTECTION CIRCUIT WITH SILICON CONTROLLED RECTIFIER CHARACTERISTICS

FIELD OF THE INVENTION

This invention relates to an electrostatic discharge (ESD) protection circuit for protecting an integrated circuit from damaging by electrostatic discharge, and more particularly to an ESD protection circuit with silicon controlled rectifier (SCR) characteristics to improve its trigger current for avoiding undesired latch-up phenomena.

BACKGROUND OF THE INVENTION

Electrostatic discharge (ESD), which is due to the accumulated charge of human bodies and machines discharged, is a serious issue for integrated circuit. The electrostatic discharges would damage the integrated circuit, due to an instant over-high voltage. For avoiding the integrated circuit from damaging by electrostatic discharges, ESD protection circuits are usually set between the pins of integrated circuit and inputs pads. Generally, the trigger voltage and holding voltage of ESD protection circuit can decide its performance. The lower trigger voltage and holding voltage are the better performance of ESD protection circuit is. Thus, many designs of ESD protection circuits are employed to provide lower trigger voltages and holding voltages.

FIG. 1 shows a silicon controlled rectifier (SCR), one of the conventional ESD protection circuit, which is issued as the U.S. Pat. No. 5,012,317. A silicon controlled rectifier 2 is interposed between an input pad 22 and circuit structure 24. The silicon controlled rectifier 2 is fabricated in a silicon based substrate 10, which is doped with P-type dopant. An N-well 12 is formed in the substrate 10, in which a first N-type doped region 14 and second P-type doped region 16 with higher concentrations than the concentration of the N-well 12 are formed therein. A third N-type doped region 18 and fourth P-type doped region 20 are formed in the: substrate 10, and connected to a reference potential. When the electrostatic discharge inputted from the input pad 22 is higher than the trigger voltage, the electrostatic discharge would be bypassed via the first N-type doped region 14 and second P-type doped region 16 through the silicon controlled rectifier 21 to the reference potential via the third N-type doped region 18 and fourth P-type doped region 20, thereby protecting the circuit structure 24 from damage.

FIG. 2 shows an equivalent circuit schematic of the silicon controlled rectifier 2 shown in FIG. 1. The resistor 13 is provided by the first N-type doped region 14 and lightly doped N-well 12 and the resistor 15 is provided by the substrate 10 and fourth P-type doped region 20, in which the N-well 12 and substrate 10 contribute the main portions of the resistor 13 and 15, respectively. The N-well 12, substrate 10, and third N-type doped region 18 serve as the collector, base, and emitter of the npn bipolar transistor 20, respectively. Similarly, the second P-type doped region 16, N-well 12, and substrate 10 serve as the emitter, base, collector of the pnp bipolar transistor 22, respectively. The equivalent circuit is connected to a reference potential, i.e. ground, for bypassing the electrostatic discharge inputted from the input pad 22.

When a normal operating voltage of ,the circuit structure 24 is inputted from the input pad 22, the junction between the N-well 12 and substrate 10 is reverse-biased. Namely, the collector-base junctions of bipolar transistors 20 and 22 are reverse-biased. Although, the emitter-base junction of bipolar transistors 20 and 22 are forward-biased, very little current is conducted by the circuit because of the reverse-biased junction between the N-well 12 and substrate 10. When the input pad 22 emits an electrostatic discharge higher than 70 volts, an avalanche occurs at the junction between the N-well 12 and substrate 10. The npn bipolar transistor 20 and pnp bipolar transistor 22 are turned on concurrently, thereby bypassing the electrostatic discharge to the reference potential. Meanwhile, that the bipolar transistors 20 and 22 providing base bias for each other allows the circuit remaining conductive in a much lower holding voltage than the avalanche voltage, until the voltage of electrostatic discharge approaches zero. Therefore, the circuit, namely silicon controlled rectifier, provides a good protection performance for the circuit structure 24, because of its low holding voltage.

Although the silicon controlled rectifier has a low holding voltage, it also needs a high trigger voltage, approximately 70–80 volts as the avalanche voltage between N-well and P-substrate, thus degrading the sensitivity to the electrostatic discharge. For lowering the trigger voltage, many patents modified the silicon controlled rectifier, such as U.S. Pat. No. 4,939,616 and U.S. Pat. No. 5,465,189, are proposed to solve this problem and reach a great success.

G. Notermans, "On the use of n-well resistors in ESD protections" Micro electronics Reliability 38 (1998) pp. 1741–1748 reports that a multiple-finger chip has difficulty to activate all the ESD protection device connected with its multiple fingers. Due to the high electrostatic current for a single ESD protection device, the ESD protection device might be triggered before it reaches the trigger voltage. The undesired trigger would seriously cause the ESD protection device a latch-up. Since the silicon controlled rectifier has many advantages, there is a huge need to modify the silicon controlled rectifier as an ESD protection circuit with a higher trigger current for avoiding undesired trigger and latch-up.

SUMMARY OF THE INVENTION

This invention discloses an ESD protection circuit for bypassing electrostatic discharges from an input pad to a reference potential. A first N-well, which has a second N-type doped region and third P-type doped region, is formed in a P-type substrate. A fourth N-type doped region and fifth doped region are formed adjacent to the first N-well in the substrate. A first conducting structure is formed on the second N-type doped region and connected to an anode. A second conducting structure is formed on the fourth N-type doped region and fifth P-type doped region and connected to a reference potential. When electrostatic discharge flows from the input pad into the ESD protection circuit, the npn bipolar transistor, which includes the first N-type well, P-type substrate, and fourth N-type region, is turned on first. While the flowing current increased, the floated pnp bipolar transistor, which includes the third P-type region, first N-well, and P-type substrate, is subsequently activated, thereby increasing the trigger current of this ESD protection circuit.

DETAILED DESCRIPTION OF THE PREFERRED EMBODIMENT

Figure 1:
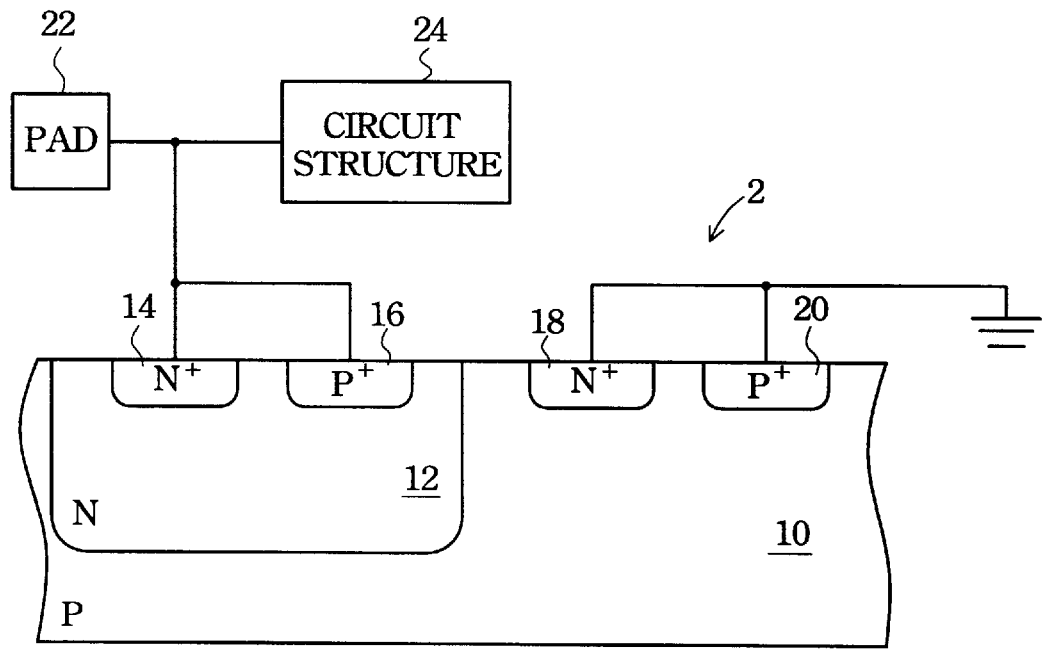
FIG. 1 is a cross-sectional view of a conventional controlled rectifier serving as an ESD protection circuit.
Figure 2:
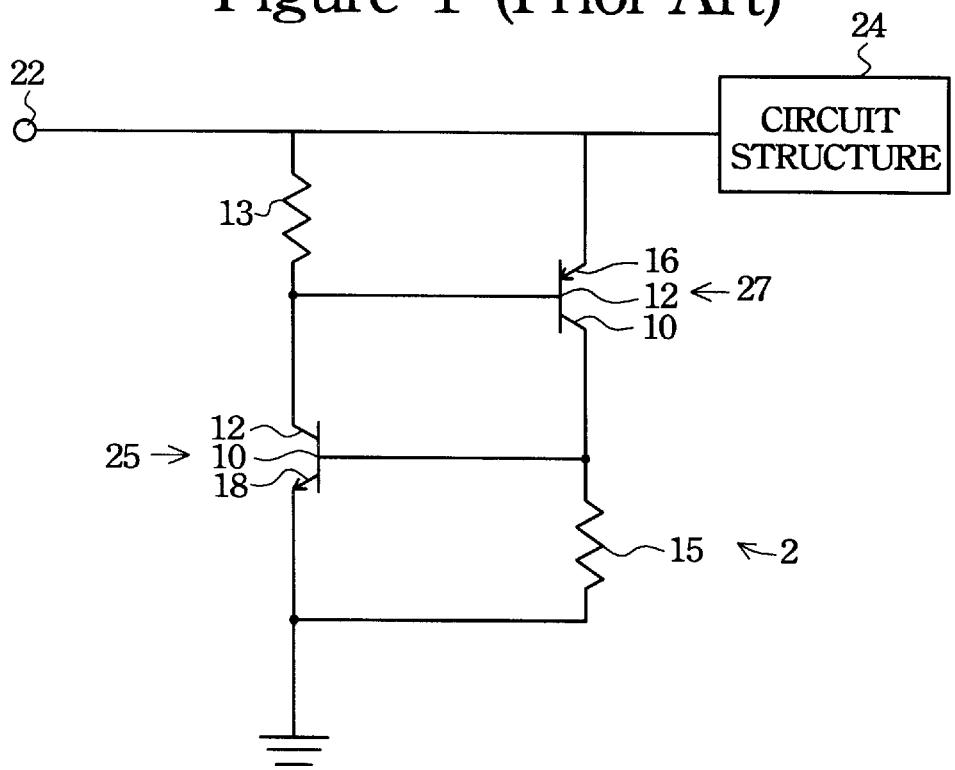
FIG. 2 is an equivalent circuit schematic of the silicon controlled rectifier.
Figure 3:
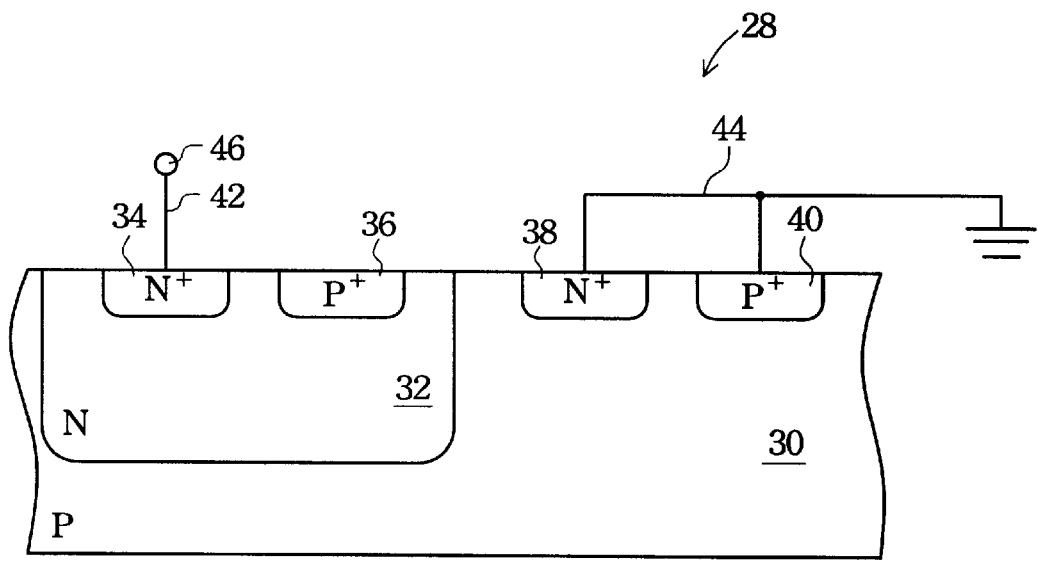
FIG. 3 is a cross-sectional view of ESD protection circuit with SCR characteristics of this invention.

This invention is based on a basic modification of the conventional SCR serving as ESD discharge protection circuit for providing various alternatives. Referring to FIG. 3, a cross-sectional view of ESD protection circuit 28 with SCR characteristics is shown. Similar to the conventional SCR, a first region 32, namely an N-well, lightly doped with N-type dopant is formed in the P-type substrate 30. A second region 34 doped with N-type dopant and third region 36 doped with P-type dopant are formed in, the first region 32, in which the concentrations of the second region and third region are higher than that of the first region. In this preferred embodiment the concentration of the first region 32 is in a range between about $5\times10^{15} \sim 8\times10^{18}$ cm$^{-3}$, and the concentrations of the second region 34 and third region 36 are in a range between about $1\times10^{17} \sim 1\times10^{21}$ cm$^{-1}$. A fourth region 38 doped with N-type dopant and fifth region 40 doped with P-type dopant are formed in the substrate 30. In this preferred embodiment the four region 38 and fifth region 40 have concentrations falling into a range between about $1\times10^{17} \sim 1\times10^{21}$ cm$^{-3}$. A first conducting structure 42 formed on the surface of substrate 30 electrically connects the second region 34 with an anode 46. The second conducting structure 44 formed on the surface of substrate 30 electrically connects the fourth region 38 and fifth region 40 to a reference potential, such as ground. According to the concern of conductivity, the first conducting structure 42 and second conducting structure 44 could be made of polysilicon, silicide, or metal. The featured modification of the ESD protection circuit 28 form the conventional SCR is the third region 36 is floated from connecting with the first conducting structure 42.

Figure 4:
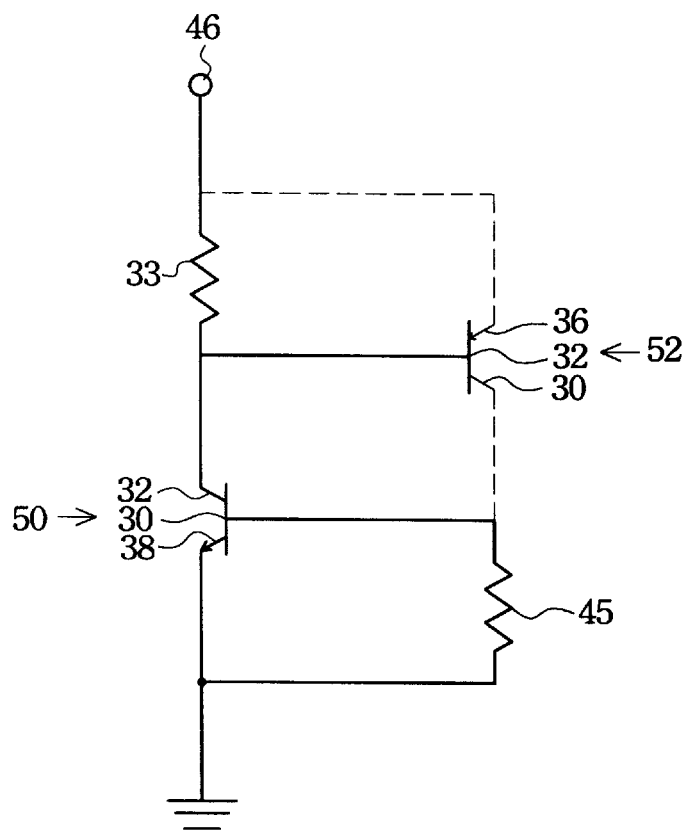
FIG. 4 is an equivalent circuit schematic of the ESD protection circuit of this invention.

The equivalent circuit and functional scheme of the ESD protection circuit 28 is illustrated in FIG. 4. The resistor 33 is provided by the second region 34 and lightly doped first region 32, which contributes the major portion of the resistor 33. The resistor 45 is provided by the fifth region 40 and substrate 30, which contributes the major portion of the resistor 45. The first region 32, substrate 30, and fourth region 36 serve as the collector, base, and emitter of the npn bipolar transistor 50, respectively. In the same manner, the third region 36, first region 32, and substrate 30 serve as the emitter, base, collector of the floated pnp bipolar transistor 52, respectively. The equivalent circuit is connected to a reference potential for bypassing the electrostatic discharge inputted from the anode 46.

Referring to FIG. 3 and FIG. 4, when a high voltage of electrostatic discharge avalanches the junction between the first region 32 and substrate 30, the bipolar transistor 50 is thus turned on bypassing the electrostatic discharge to the reference potential. As the current of electrostatic discharge raises to a specific intensity, many carriers in a high-level injection state avalanches the junction between the first region 32 and third region 36, thereby turning on the floated pnp bipolar transistor 52. The bipolar transistor 50 and floated bipolar transistor 52 constitute a conventional SCR, which provides a positive feedback route between the transistors 50, 52 to ensure it a low holding voltage.

Figure 5:
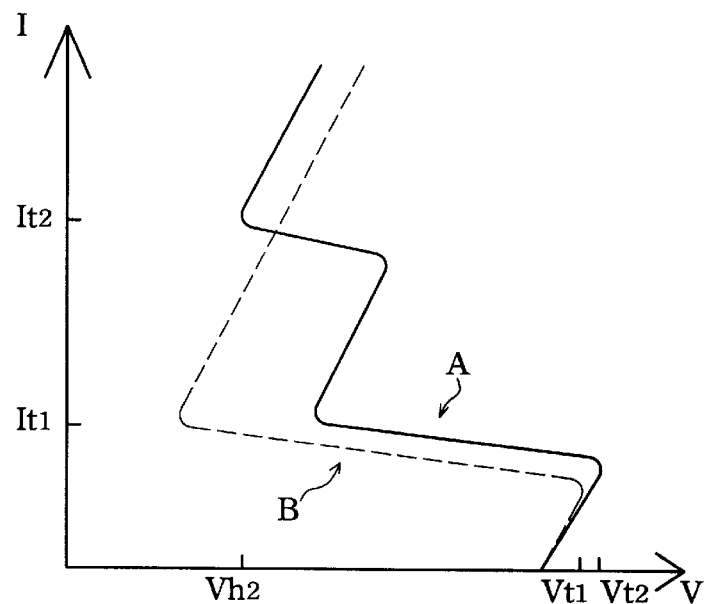
FIG. 5 is a diagram of I–V curves to demonstrate the advantages brought from this invention.

FIG. 5 shows a comparison according to I–V curves of the conventional SCR and this ESD protection circuit. The line B represents the relation between current and voltage of the conventional SCR, and the line A represents the relation between current and voltage of this ESD protection circuit. The trigger voltage Vt2 of this ESD protection circuit is close to the trigger voltage Vt1 of the conventional SCR. However, the trigger current It2 of this ESD protection circuit is significantly higher than the trigger current It1 of the conventional SCR. It is because that the floated bipolar transistor 52 (see FIG. 4) is turned on at a high level current, and only if the floated bipolar transistor is activated, this ESD protection circuit would operate in a low holding voltage Vh2. Therefore, this ESD protection circuit maintains the advantage of low holding voltage, and increases the trigger current, thus improving the sensitivity of the circuit and avoiding the undesired latch-up.

Figure 6:
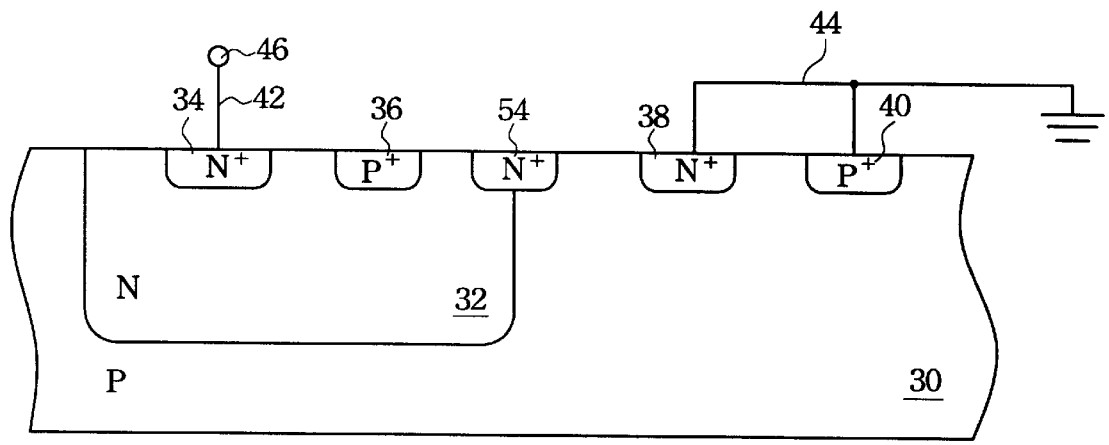
FIG. 6 is a cross-sectional view of ESD protection circuit as a first alternative of this invention.

FIG. 6 shows an alternative of this ESD protection circuit. The modification of this alternative is implanted a six region 54 highly doped with N-type dopant over the interface between the first region 32 and substrate 30. In this preferred embodiment, the sixth region has a concentration in a range between about $1\times10^{17} \sim 1\times10^{21}$ cm$^{-3}$. Since the concentration of the sixth region 54 is higher than that of the first region 32, it provides a better conductivity. As a result of high voltage of electrostatic discharge, the more condensed carriers accumulated in the sixth region 54 would easily avalanche the junction between the sixth region 54 and substrate 30 to turn the ESD protection circuit with SCR characteristics. Therefore, the ESD protection circuit provides a higher trigger current with lower trigger voltage.

Figure 7:
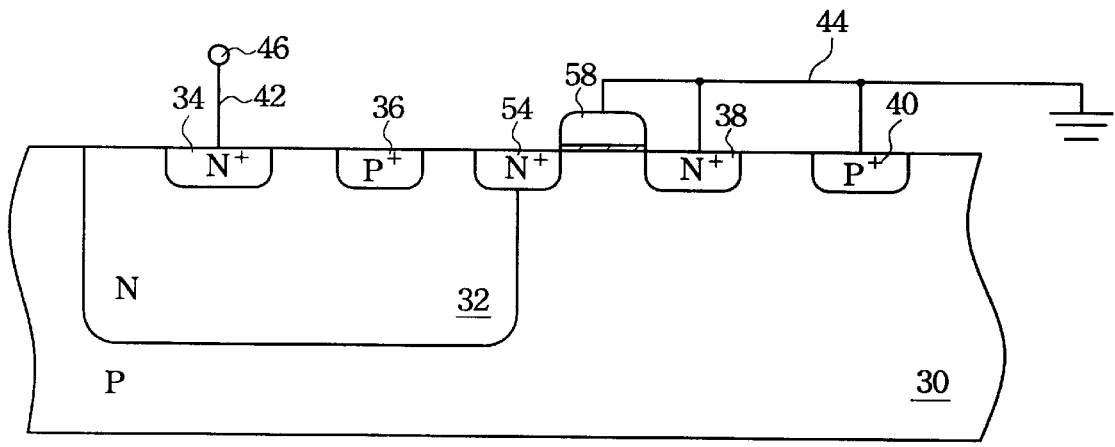
FIG. 7 is a cross-sectional view of ESD protection circuit as a second alternative of this invention.

FIG. 7 shows another alternative of this ESD protection circuit. The modification of this alternative is formed a N-type doped sixth region 54 over the interface between the first region 32 and substrate 30 and a gate structure 58 on the surface of substrate 30 between the sixth region 54 and fourth region 38. The gate structure 58, which connects to the second conducting structure 44, in association with the fourth region 381 and sixth region 54 serves as a gate of a NMOS transistor. Once enough current flows to trigger the ESD protection circuit, the region between the third region 36 and fourth region 38 gets flooded with carriers. This effective shorts the energy of the ESD pulse to the reference potential. Therefore, in contrast to the conventional SCR, this ESD protection circuit is effective in providing input protection.

Figure 8:
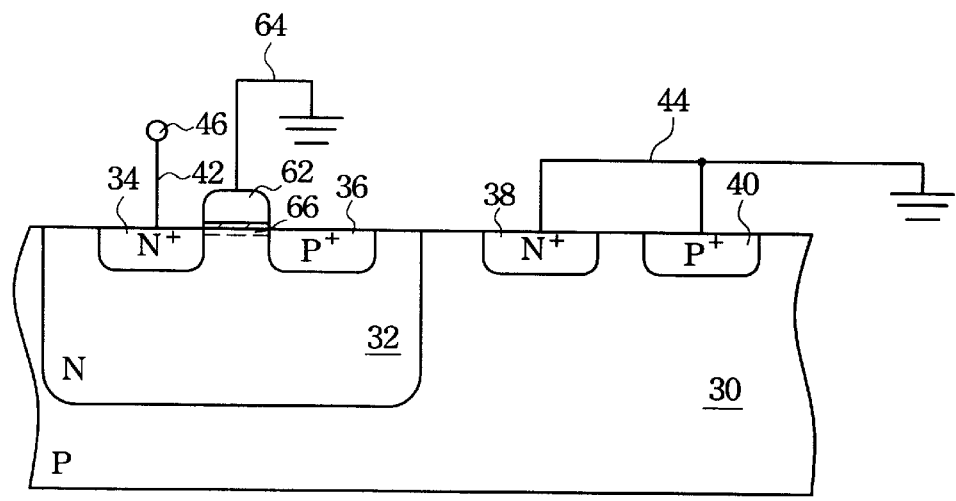
FIG. 8 is a cross-sectional view of ESD protection circuit as a third alternative of this invention.

FIG. 8 shows yet another alternative of this ESD protection circuit. The alternative is based on the ESD protection circuit 28 in FIG. 3 and featured on a gate structure 62, which lies on the surface of first region 32 between the second region 34 and third region 36, and electrically connects to the ground through a third conducting structure 64. As a result of N-type dopant the first region 32, the gate structure 62 generates an inversion layer 66 between the second region 34 and third region 36. The inversion layer 66 allows the carriers easily to punch through the junction between the second region 34 and first region 32 into the third region 36, so as to turn on the pnp bipolar transistor, which is constituted by the third region 36, first region 32, and substrate 30. Thus, the trigger voltage of this alternative could be reduced and the trigger current could be raised, due to the floated pnp bipolar transistor 30.

Figure 9:
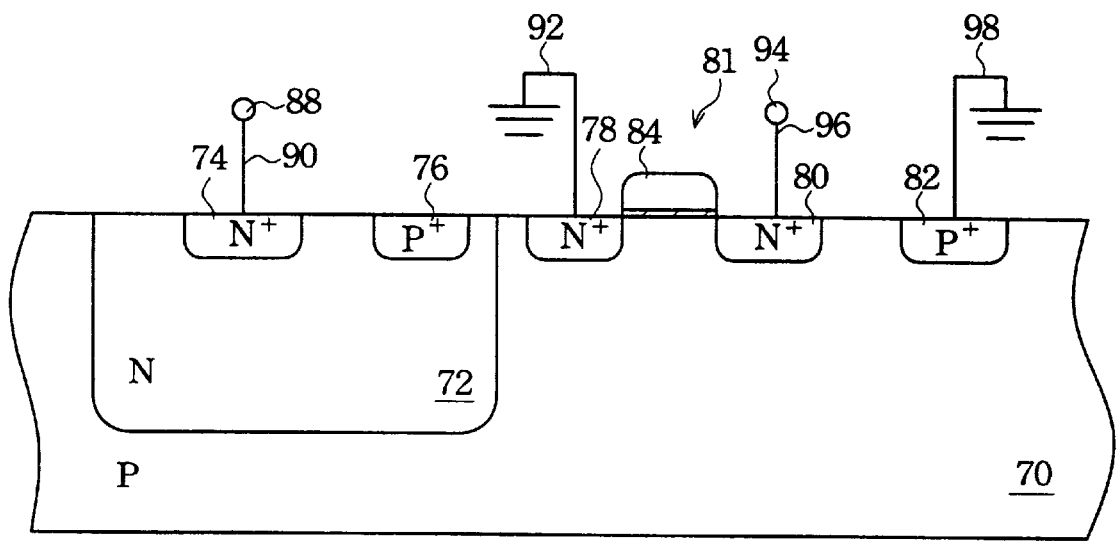
FIG. 9 is a cross-sectional view of ESD protection circuit as a fourth alternative of this invention.

FIG. 9 is another alternative of this ESD protection circuit. Similarly, a first N-type doped region 72, which has two highly dope regions, the second N-type doped region 74 and third P-type doped region 76, is formed in a P-type doped substrate 70. An NMOS transistor 81 with a gate structure 84, fourth N-type doped region 78, and fifth N-type doped region 80 is formed close to the first N-type doped region 72. A sixth P-type doped region 82 is formed in the substrate 70. A first conducting structure 90 is formed on the second N-type doped region 74 and connected to an anode 88. A third conducting structure 96 is formed on the fifth N-type doped region 80 and connected to an anode 94. Likewise, the second and third conducting structures 92, 98 are formed on the fourth and fifth regions 78, 82 and connected to a reference potential, i.e. ground. The first N-type doped region 72 has a constration in a range between about $5\times10^{15}$~$8\times10^{18}$ cm$^{-3}$. The second N-type doped region 74 and third P-type doped region have concentrations in a range between $1\times10^{17}$~$1\times10^{21}$ cm$^{-3}$ higher than that of the first N-type doped region. When electrostatic discharge flows via the anode 88, the npn bipolar transistor, which includes the second N-type doped region 74, first N-type doped region 72, substrate 70, and fourth N-type doped region 78, would be turned on first. The current flowing via the anode 94 into the NMOS transistor 81 would enhance the carriers of this ESD protection circuit to a high-level injection state, thereby reducing its trigger voltage. In addition, since the third P-type doped region 76 is free from connecting with the anode 88, the trigger current of this ESD protection circuit could also be raised.

As is understood by a person skilled in the art, the foregoing preferred embodiments of the present invention that are illustrated of the present invention rather than limiting of the present invention. It is intended to cover various modifications and similar arrangements included within the spirit and scope of the appended claims, thee scope of which should be accorded the broadest interpretation so as to encompass all such modifications and similar structure.

What is claimed is:

1. An electrostatic discharge protection circuit with silicon controlled rectifier characteristics for protecting an integrated circuit from damaging by electrostatic discharge, the electrostatic discharge protection circuit comprising:

a substrate doped with P-type dopant;

a first region doped with N-type dopant formed underlying a surface of the substrate;

a second region doped with N-type dopant formed underlying the surface in the first region;

a third region doped with P-type dopant formed floating underlying the surface in the first region and bounded by the first region, the third region separated and spaced from the second region by a portion of the first region;

a fourth region doped with N-type dopant formed underlying the surface in the substrate, the fourth region separated and spaced from the third region by at least a portion of the substrate;

a fifth region doped with P-type dopant formed underlying the surface in the substrate, the fifth region separated and spaced from the fourth region;

a first conducting structure connecting the fourth region and the fifth region to a reference potential; and a second conducting structure connecting the second region and an input pad for introducing electrostatic discharge passing through the second region, the first region, the substrate, and the fourth region to the reference potential, after the electrostatic discharge reaching the reference potential and a current of the electrostatic discharge getting to a trigger current, the electrostatic discharge injecting into the third region and passing through the first region, the substrate, and the fifth region to the reference potential, thereby increasing a trigger current of the electrostatic discharge protection circuit.

2. The electrostatic discharge protection circuit of claim 1, wherein the first region has a concentration in a range between about $5\times10^{15}$~$8\times10^{18}$ cm$^{-3}$.

3. The electrostatic discharge protection circuit of claim 1, wherein the second region, third region, fourth region, and the fifth region have concentrations in a range between about $1\times10^{17}$~$1\times10^{21}$ cm$^{-3}$.

4. An electrostatic discharge protection circuit with silicon controlled rectifier characteristics for protecting an integrated circuit from damaging by electrostatic discharge, the electrostatic discharge protection circuit comprising:

a substrate doped with P-type dopant;

a first region doped with N-type dopant formed underlying a surface of the substrate;

a second region doped with N-type dopant formed underlying the surface in the first region;

a third region doped with P-type dopant formed floating underlying the surface in the first region, the third region separated and spaced from the second region by a portion of the first region;

a NMOS transistor formed on the substrate, the NMOS transistor having a fourth N-type doped region and a fifth N-type doped region, in which the fourth N-type doped region is positioned between the third region and the fifth N-type doped region, the fourth N-type doped region and the fifth N-type doped region being separated and spaced from the first region by a portion of the substrate and being provided outside the first region;

a sixth region doped with P-type doped region formed underlying the surface, the sixth region separated and spaced from the NMOS in the substrate;

a first conducting structure connecting the sixth region to a reference potential;

a second conducting structure connecting the fourth N-type doped region to the reference potential;

a third conducting structure connecting the fifth N-type doped region and a first anode;

and a fourth conducting structure connecting the second region with a second anode for introducing electrostatic discharge passing through the second region, the first region, the substrate, and the fourth N-type doped region to the reference potential, after the electrostatic discharge reaching the reference potential, the inputting voltage from the second anode enhancing the electrostatic discharge injecting into the third region and passing through the first region, the substrate, and the sixth region to the reference potential, thereby increasing a trigger current and reducing a trigger voltage of the electrostatic discharge protection circuit.

5. The electrostatic discharge protection circuit of claim 4, wherein the first region has a concentration in a range between about $5\times10^{15}$~$8\times10^{18}$ cm$^{-3}$.

6. The electrostatic discharge protection circuit of claim 4, wherein the second region and the third region have concentrations in a range between about $1\times10^{17}$~$1\times10^{21}$ cm$^{-3}$.

7. The electrostatic discharge protection circuit of claim 4, wherein the first conducting structure, the second conducting structure, the third conducting structure, and the fourth conducting structure are made of a material selected from a group consisting of polysilicon, silicide, metal, and a combination thereof.

* * * * *